(12) United States Patent
Blish, II

(10) Patent No.: US 6,285,181 B1
(45) Date of Patent: Sep. 4, 2001

(54) METHOD AND SYSTEM FOR DETERMINING THE LOCATION OF AN OPEN CIRCUIT IN A SEMICONDUCTOR DEVICE USING POWER MODULATION

(75) Inventor: Richard C. Blish, II, Saratoga, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/177,759

(22) Filed: Oct. 23, 1998

(51) Int. Cl.⁷ .................................................. G01R 31/28
(52) U.S. Cl. .................... 324/95; 324/158.1; 324/529; 324/530; 340/560
(58) Field of Search ............................ 324/765, 769, 324/763, 764, 751, 546, 73.1, 144, 529, 530, 95; 340/560

(56) References Cited

U.S. PATENT DOCUMENTS

| | | | |
|---|---|---|---|
| 3,590,370 | * 6/1971 | Feischer | 324/73.1 |
| 5,017,877 | * 5/1991 | Haus, Jr. | 324/546 |
| 5,247,281 | * 9/1993 | Facon et al. | 340/560 |
| 5,523,694 | * 6/1996 | Cole, Jr. | 324/751 |

* cited by examiner

Primary Examiner—Safet Metjahic
Assistant Examiner—Jimmy Nguyen
(74) Attorney, Agent, or Firm—Sawyer Law Group LLP

(57) ABSTRACT

A system and method for detecting a location of an open circuit is disclosed. The open circuit is in a circuit of semiconductor device. The semiconductor device has a surface. The method and system include supplying alternating power to the semiconductor device and sensing a time-varying signal that is related to the alternating power. The method and system also include determining where the signal is substantially changed.

7 Claims, 3 Drawing Sheets

METHOD AND SYSTEM FOR DETERMINING THE LOCATION OF AN OPEN CIRCUIT IN A SEMICONDUCTOR DEVICE USING POWER MODULATION

FIELD OF THE INVENTION

The present invention relates to semiconductor devices and more particularly to a method and system for identifying locations of open circuits within the semiconductor device.

BACKGROUND OF THE INVENTION

Semiconductor devices often include circuits formed in an active area of a semiconductor die. To fabricate the conventional semiconductor device, the die is mounted active area up on a substrate. The die is then encapsulated. Flip-chip semiconductor devices are fabricated by mounting the die with the active area down, toward the substrate. Thus, the circuits in the active area of a flip-chip device are less accessible than in a conventional device.

Irrespective of the type of semiconductor device, faults can occur in the circuits within the active area of the die. One such fault is an open circuit. Open circuits adversely impact the performance of the semiconductor device. Consequently, it is desirable to detect the existence and location of open circuits.

One conventional method for determining the location of an open circuit uses a SEM (scanning electron microscope) to image circuits in the die. While power is supplied to the die, the SEM images the die. Portions of the image may appear dark because electrons are attracted to a positive voltage provided by an open circuit. Thus the location of the open circuit can be detected using the SEM. Another conventional method for finding the sites of open circuits is to deprocess the die, layer by layer. Each layer is inspected to determine if the location of an open circuit is within the layer.

Although the conventional methods function, in order for the SEM to be effective, the probe of the SEM must be placed very near the circuits in the die. Thus, the die must at least be decapsulated. Furthermore, in flip-chip devices, even decapsulation does not expose the active area, which is mounted to the substrate. Thus, detection of open circuits using the SEM is made significantly more difficult. Similarly, although deprocessing can reveal the location of a short, deprocessing also destroys the device. Thus, it may be impossible to perform other tests on the device once deprocessing has commenced.

Accordingly, what is needed is a system and method for detecting shorts in a circuit of a semiconductor die. The present invention addresses such a need.

SUMMARY OF THE INVENTION

The present invention provides a method and system for detecting a location of an open circuit. The open circuit is in a circuit of semiconductor device that has a surface. The method and system comprise supplying alternating power to the semiconductor device and sensing a time-varying signal that is related to the alternating power. The method and system also comprise determining where the signal is substantially changed.

According to the system and method disclosed herein, the present invention allows detection of open circuits without substantial destruction of the device. The detecting the locations of faults is thereby simplified.

DETAILED DESCRIPTION OF TIE INVENTION

The present invention relates to an improvement in detection of faults in a semiconductor die. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1A:
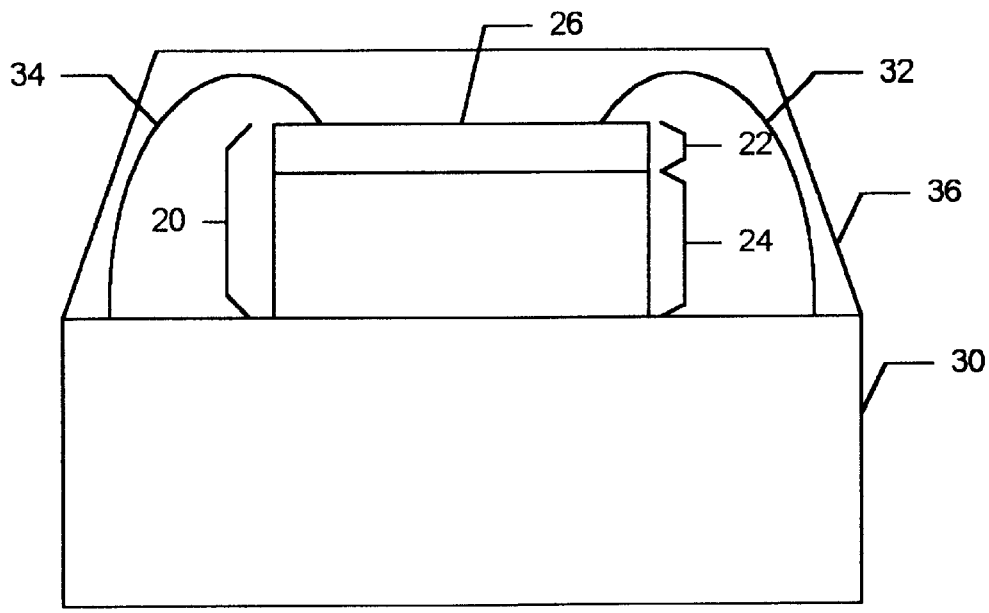
FIG. 1A is a block diagram of a conventional semiconductor device.
Figure 1B:
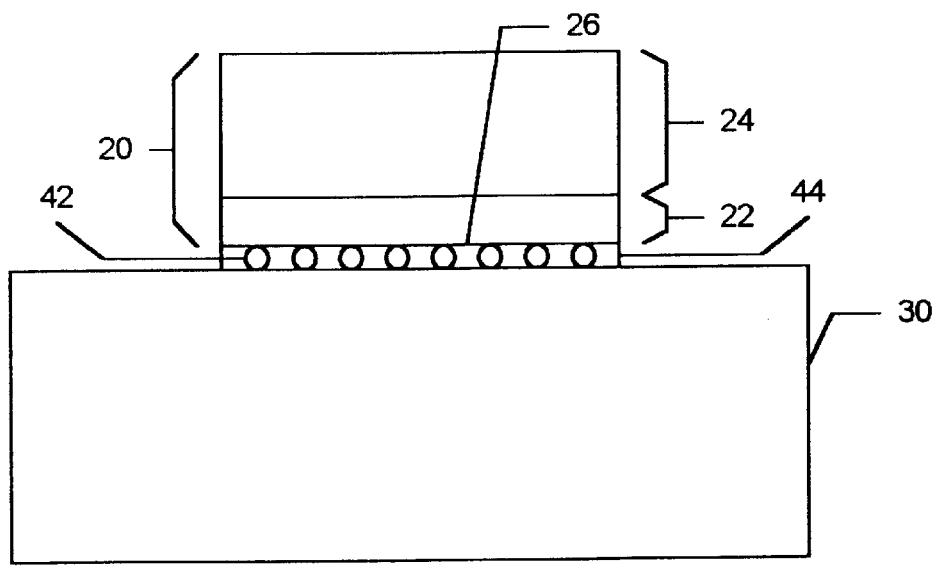
FIG. 1B is a diagram depicting a flipchip device.

FIGS. 1A and 1B depict semiconductor devices. Referring to FIG. 1A, a conventional semiconductor device 10 is depicted. The conventional device 10 includes a die 20 having an active area 22. The active area 22 includes circuits (not shown) formed on the die 20. The remainder 24 of the die 20 is referred to as an inactive area 24. The die 20 is mounted on a substrate 30 with the surface 26 of the active area 22 face up. Electrical connection is made between the circuits on the die 20 and the substrate 30 with leads 32 and 34. The die 20 may then be encased in an encapsulant 36.

Referring now to FIG. 1B, a conventional flip-hip device 40 is depicted. The flip-chip device 40 includes the die 20 and the substrate 30. The active area 22 of the die 20 includes circuits (not shown). The die 20 is mounted with the surface 26 of the active area 22 in proximity to the substrate 30. Solder balls 42 electrically couple the circuits in the die 20 to the substrate 30. The die is physically coupled to the substrate 30 using an underfill 44.

Faults can occur in the circuits within the active area 22 of the die 20 in either the conventional device 10 or the flip-chip device 40. One fault is an open circuit. Detection of the existence and location of open circuits is, therefore, desirable.

Figure 2:
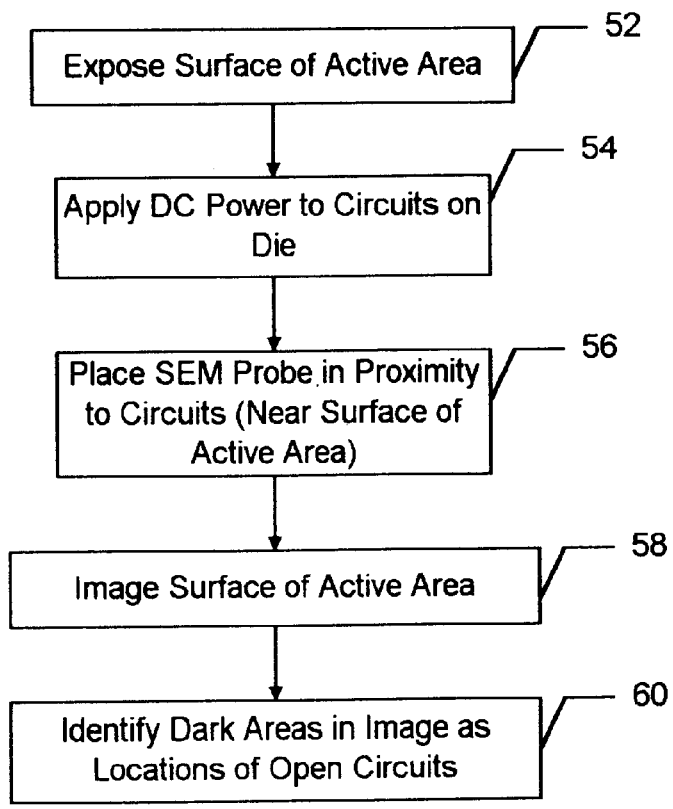
FIG. 2 is a flow chart depicting a conventional method for detecting the location of an open circuit.

FIG. 2 depicts one conventional method 50 for determining the location of an open circuit. The surface 26 of the active area 22 is exposed, via step 52. For the conventional device 10, the encapsulant 32 is removed in step 52. A constant power is then applied to the device 10, via step 54. The device 10 is then placed in a SEM (scanning electron mnicroscope), with the probe of the SEM in proximity to the surface 26 of the active area, via step 56. While power is supplied to the die 20, the SEM images surface 26 of the active area 22, via step 58. Near the locations of open circuits, the image will abruptly appear dark because the discontinuity of voltage generated across the open circuit attracts electrons. Thus, dark areas in the image are determined to be open circuits, via step 60. Although not depicted in FIG. 2, another conventional method for determining the locations of open circuits is to deprocess the semiconductor device 10 or 40. During deprocessing, layers of the device 10 or 40 are removed. As a layer is removed, the exposed portion of the device 10 or 40 is investigated to find any open circuits.

Although the conventional methods function, one of ordinary skill in the art will realize that both methods have several drawbacks. If the open circuit is detected using the SEM, the probe of the SEM must be placed very near the circuits in the die 20. Thus, the encapsulant 36 must be removed from the conventional device 10. Furthermore, in the flip-chip device 40, the die 20 is mounted with the surface 26 close to the substrate. To expose the surface 26, the die 20 must be substantially thinned for back side examination or be separated from the substrate 30 for the SEM to detect open circuits. However, separating the die 20 from the substrate 30 may render the circuits inoperable. Thus, detection of open circuits using the SEM is made significantly more difficult. One of ordinary skill in the art will also realize that deprocessing the conventional device 10 or the flip-chip device 40 destroys the device.

The present invention provides a method and system for detecting a location of an open circuit in a circuit of a semiconductor device. The semiconductor device has a surface. The method and system comprise supplying alternating power to the semiconductor device and sensing a time-varying signal that is related to the alternating power. The method and system also comprise determining where the signal is substantially changed.

The present invention will be described in terms of particular frequencies, wavelengths, and mechanisms for sensing the time-varying signal. However, one of ordinary skill in the art will readily recognize that this method and system will operate effectively for other frequencies, other wavelengths, and other mechanisms for sensing a time-varying signal.

Figure 3:
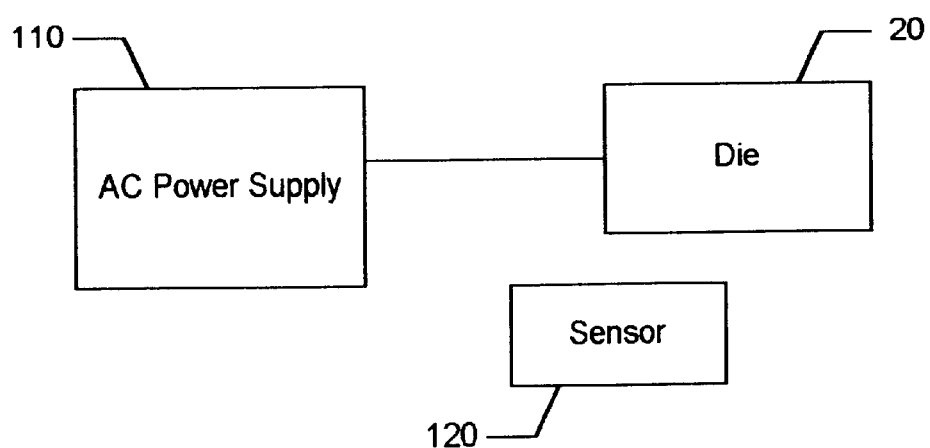
FIG. 3 is a block diagram of a system for detecting open circuits in accordance with the present invention.

To more particularly illustrate the method and system in accordance with the present invention, refer now to FIG. 3 depicting a block diagram of one embodiment of a system 100 for detecting open circuits in accordance with the present invention. The system 100 includes an AC power supply 110. The AC power 110 supply may apply an AC modulation on a DC bias. The AC power supply 110 is coupled with circuits in the die 20. Thus, the AC power supply 110 provides alternating power to the circuits in the die 20. The system 100 also includes a sensor 120. In a preferred embodiment, the sensor 120 includes two antennae. If two antennae are used, the antennae are used in proximity to the device 10 to achieve an interference measurement.

Figure 4:
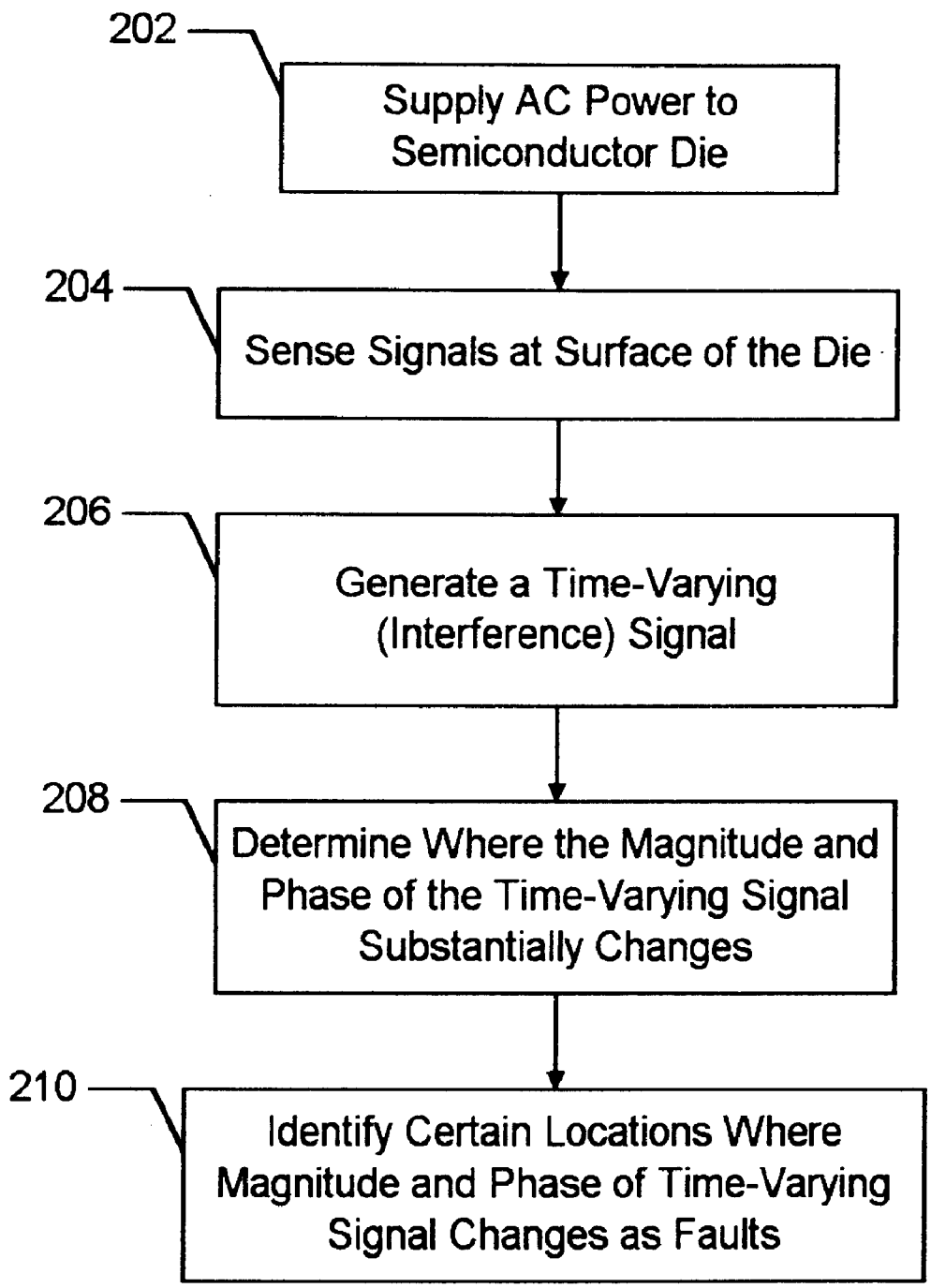
FIG. 4 is a flow chart depicting a method for determining the location of a short in accordance with the present invention.

FIG. 4 depicts one embodiment of a method 200 for detecting the locations of open circuits in accordance with the present invention. Alternating power is provided to the circuits in the semiconductor die 20, via step 202. In a preferred embodiment, the alternating power has a frequency high enough that the wavelength of electromagnetic radiation generated is short enough to achieve the desired spatial resolution. In a preferred embodiment, the desired spatial resolution is on the order of the feature size. The feature size in on the order of a micron or less and the frequency is ten to one hundred gigahertz. Thus, in a preferred embodiment, two antennae are used to provide an interference measurement. The interference measurement achieves a spatial resolution that is on the order of the feature size and shorter than a wavelength of the electromagnetic radiation. However, the method and system are consistent with use of a single antenna when the signal has a frequency sufficient to provide the desired spatial resolution can be generated.

A signal across a surface of the semiconductor die 20 is then sensed, via step 204. In one embodiment, step 204 is performed by using a pair of antennae in the sensor 120 to pick up electromagnetic radiation having a frequency close to that of the alternating power supplied to the die 20. A first antennae picks up a first signal in the vicinity of the semiconductor die 20. The second antenna is used to pick up a second signal in the vicinity of the semiconductor die. In the preferred embodiment, an interference signal is generated from the first signal and the second signal, via step 206. The interference signal or the difference in phase between the first and second signal is the time-varying signal of interest. Thus, in this case, the pair antennae are used to sense an interference signal. However, in an embodiment where a single antenna can be used, the time varying signal of interest could be the signal sensed by the antenna and no interference signal is generated. Also in one embodiment, the surface across which the time-varying signal is sensed may be the surface 26 of the active area 22. However, nothing prevents another surface of the die 20 from being used.

It is then determined where the time-varying signal changes, via step 208. Because two antennae are used, changes in the magnitude and phase of the interference signal are sensed in step 208. Via step 210, certain locations at which the time-varying signal changes are determined to be the locations of the open circuits. In a preferred embodiment, the determination of open circuits is made by comparing the interference signal on the die 20 having faults with the interference signal generated at a similar position on a functioning die. This helps to ensure that changes in the time-varying (interference) signal are due to the open circuits rather than being due to propagation delays or other phenomenon existing in functioning dies. Thus, the locations of open circuits can be determined.

The system 100 and method 200 need not bring the sensor 120 in proximity to the surface 26 to be able to detect the location of open circuits. Thus, some decapsulation may be avoided. The method 200 and system 100 may also be used with the flip-chip device 40 because the surface 26 need not be exposed. The system 100 and method 200 in accordance with the present invention also may not require that the device 10 or 40 be deprocessed in order to locate open circuits. Thus the device 10 or 40 can be preserved for further testing. Therefore detection of locations of faults using the method 200 and system 100 in accordance with the present invention is simplified and made less time consuming.

A method and system has been disclosed for detecting locations of open circuits in a semiconductor device. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spint and scope of the appended claims.

What is claimed is:

1. A method for detecting a location of an open circuit in a circuit of semiconductor device having a surface, the method comprising the steps of:

(a) supplying alternating power to the semiconductor device;

(b) sensing a time-varying signal related to the alternating power from the surface of the semiconductor device using at least a first antenna, the time-varying signal being based on an electromagnetic radiation signal; and (c) determining where the time-varying signal is substantially changed wherein the time varying signal includes a magnitude and a phase, and wherein the sensing step (b) further includes the step of:

(b1) utilizing the first antenna and a second antenna provide the time-varying signal, the first antenna sensing a first signal in proximity to the surface of the semiconductor die and the second antenna sensing a second signal in proximity to the surface of the semiconductor device, the time-varying signal being an interference signal between the first signal and the second signal.

2. The method of claim 1 wherein the alternating power supplying step (a) further includes the step of.

(a1) supplying alternating power to the semiconductor device substantially at a fist frequency.

3. The method of claim 1 wherein change determining step (c) further includes the step of (c1) determining where a magnitude and phase of the time-varying signal change.

4. The method of claim 3 wherein location determining step (d) further comprising the step of:

(d) comparing the change in the time-varying signal to fault-free interference signal, the fault-free interference signal being generated an open circuit free die.

5. A system for detecting a location of an opt circuit in a circuit of semiconductor device having a surface, the system comprising:

an alternating power supply for supplying power to the circuit in the semiconductor device; and a sensor for sensing a time-varying signal related to the alternating power from the surface of the semiconductor device, the sensor including at least a first antenna, the time-varying signal being based on an electromagnetic radiation signal;

wherein the location of the open circuit is in proximity to a location that the time-varying signal is substantially changed;

wherein the sensor further includes a second antenna, the first antenna for sensing a first signal in proximity to the surface of the semiconductor device and the second antenna for sensing a second signal in proximity to the surface of the semiconductor device; and Wherein the time-varying signal is an interference signal between the first signal and the second signal.

6. The system of claim 5 wherein the alternating power supply supplies alternating power to the semiconductor device substantially at a first frequency.

7. The system of claim 5 further comprising:

means for determining the location of the open circuit as a location where the time-varying signal changes, the determining means further including means for comparing the change in the time-varying signal to fault-free interference signal, the fault-free interference signal being generated an open circuit free die.

* * * * *